(12) United States Patent
Shiotani

(10) Patent No.: US 9,807,529 B2
(45) Date of Patent: Oct. 31, 2017

(54) WIRELESS RECEIVER

(71) Applicant: KABUSHIKI KAISHA AUDIO-TECHNICA, Machida-shi, Tokyo (JP)

(72) Inventor: Masaki Shiotani, Machida (JP)

(73) Assignee: KABUSHIKI KAISHA AUDIO-TECHNICA, Machida-Shi, Tokyo (JP)

( * ) Notice: Subject to any disclaimer, the term of this patent is extended or adjusted under 35 U.S.C. 154(b) by 0 days.

(21) Appl. No.: 15/295,355

(22) Filed: Oct. 17, 2016

(65) Prior Publication Data

US 2017/0111749 A1    Apr. 20, 2017

(30) Foreign Application Priority Data

Oct. 19, 2015  (JP) ................................. 2015-205504

(51) Int. Cl.
*H04R 29/00* (2006.01)
(52) U.S. Cl.
CPC ......... *H04R 29/004* (2013.01); *H04R 29/008* (2013.01)
(58) Field of Classification Search
CPC .... H04R 29/04; H04R 29/008; H04R 25/554; H04R 25/505; H04W 8/22
USPC ......... 381/58, 92, 120, 74.56, 122; 455/408, 455/556.1; 704/500
See application file for complete search history.

(56) References Cited

U.S. PATENT DOCUMENTS 5,613,232 A * 3/1997 Toshida ............... H04B 17/309
                                                            455/154.2
2004/0029539 A1 * 2/2004 Sadahiro .................. H03F 1/12
                                                            455/130

FOREIGN PATENT DOCUMENTS

JP         S58-87924 A      5/1983

* cited by examiner

*Primary Examiner* — Melur Ramakrishnaiah
(74) *Attorney, Agent, or Firm* — Manabu Kanesaka

(57) ABSTRACT

A wireless receiver, which receives a radio wave (RF) signal from a wireless microphone, demodulates an audio signal, and displays an RF reception state proportional to strength of a received signal on an indicator, includes a first frequency conversion (FC) unit generating a first IF signal based on the received RF signal; a second FC unit generating a second IF signal based on the first IF signal; a first received RF strength measuring unit detecting a first level signal from the first IF signal generated by the first FC unit; a second received RF strength measuring unit detecting a second level signal from the second IF signal generated by the second FC unit; and a synthesizing unit synthesizing the first level signal detected by the first received RF strength measuring unit and the second level signal detected by the second received RF strength measuring unit, and outputs a synthesized level signal.

5 Claims, 2 Drawing Sheets

WIRELESS RECEIVER

RELATED APPLICATIONS

The present application is based on, and claims priority from, Japanese Application No. JP2015-205504 filed Oct. 19, 2015, the disclosure of which is hereby incorporated by reference herein in its entirety.

BACKGROUND OF THE INVENTION

Field of the Invention

The present invention relates to a wireless receiver that receives a radio wave from, for example, a wireless microphone and demodulates an audio signal, in particular, to the wireless receiver which can appropriately display a radio wave reception state on an indicator.

Description of the Related Art

A wireless microphone and a wireless receiver are normally used in one-to-one relation. That is, in multi-wave operation in which a plurality of wireless microphones is simultaneously used on a stage or the like, the same number of wireless receivers tuned with transmission frequencies of the respective wireless microphones are used.

In this case, according to Japanese Radio Law, for example, as a frequency band that can be used for a type B wireless microphone, 30 channels are allocated for a specified low power radio device, in which a range of 806.125 to 809.750 MHz is equally divided in units of 0.125 MHz.

Therefore, in a case where the plurality of wireless microphones is simultaneously used as described above, it is necessary to set an oscillation frequency of each of the wireless microphones so that the wireless receiver is not influenced by co-channel disturbance, adjacent-channel disturbance, or intermodulation disturbance, and that an operation is necessary to match a reception frequency of the wireless receiver to be paired with the oscillation frequency of each of the wireless microphones.

By the way, a reception state of the radio wave received in each wireless receiver can be known by a reception strength (also referred to as a reception level) displayed on an indicator. What is displayed on the indicator is preferably in proportion to the received radio wave strength ideally.

However, in a case where the received radio wave strength is too weak or too strong, the magnitude of the reception strength may not be displayed on the indicator correctly.

This is because detection sensitivity of a conventional wireless receiver has a dynamic range of about 70 dB at the maximum, and cannot cover a dynamic range of 100 dB which is a range of the generally used wireless receiver from minimum sensitivity 20 dBμVemf to maximum sensitivity 120 dBμVemf. That is, in a weak electric field or a strong electric field, there has been a problem that accurate detection cannot be made for the radio wave strength below or above a predetermined setting range, and the indication is fixed.

A patent document JP 58-87924 A discloses a signal generation system for signal strength display that generates an out-of-range detection signal when an output level (output voltage) corresponding to an input signal for displaying signal strength is outside a predetermined range, and compresses the output level with a predetermined characteristic so as to fall within the predetermined range.

The document discloses that the signal generation system for signal strength indicator outputs a highly accurate DC level proportional to a logarithm of an input level of a wide dynamic range, and enables to display an accurate signal strength. According to a configuration of an invention disclosed in JP 58-87924 A, an output level of magnitude proportional to received signal strength can be obtained as long as the output level of the input signal for displaying the signal strength is within the predetermined range.

However, since the output level of the input signal is compressed when the output level exceeds the predetermined range, the output level accurately proportional to the magnitude of the reception level has not been obtained.

SUMMARY OF THE INVENTION

The present invention has been made in view of the points described above, and an object thereof is to provide a wireless receiver that receives a radio wave from a wireless microphone and demodulates an audio signal, the wireless receiver being capable of displaying, on an indicator, a radio wave reception state accurately proportional to strength of a received signal.

In order to solve the above-described problem, a wireless receiver according to the present invention, which receives a radio wave from a wireless microphone and demodulates an audio signal, includes: a first frequency conversion unit that generates a first intermediate frequency signal based on the received radio wave signal; a second frequency conversion unit that generates a second intermediate frequency signal based on the first intermediate frequency signal; a first received radio wave strength measuring unit that detects a first level signal from the first intermediate frequency signal generated by the first frequency conversion unit; a second received radio wave strength measuring unit that detects a second level signal from the second intermediate frequency signal generated by the second frequency conversion unit; and a synthesizing unit that synthesizes the first level signal detected by the first received radio wave strength measuring unit and the second level signal detected by the second received radio wave strength measuring unit, and outputs a synthesized level signal.

The wireless receiver preferably includes an indicating unit that displays radio wave strength on an indicator, based on the synthesized level signal output from the synthesizing unit.

The wireless receiver preferably includes a muting unit that performs mute control by using the synthesized level signal outputted from the synthesizing unit, as a reference signal.

The wireless receiver preferably includes an attenuation unit that performs attenuation processing of an RF signal by using the synthesized level signal output from the synthesizing unit, as a reference signal.

The first level signal indicates that a reception level can be detected in a weak electric field range and the second level signal indicates that a reception level can be detected in a range from a medium electric field to a strong electric field.

With this configuration, the radio wave strength in a range outside a measurable range of the first received radio wave strength measuring unit can be measured by the second received radio wave strength measuring unit, and the radio wave reception state can be accurately displayed in the indicator in a wide dynamic range from a weak electric field to a strong electric field.

With the wireless receiver according to the present invention, electric field strength can be accurately detected, so that a radio wave state under a use environment can be correctly known, and, for example, the detection signal obtained can be used as a reference signal of the mute control or a reference signal of an attenuator (attenuation unit) for stable operation of the wireless microphone.

DESCRIPTION OF THE PREFERRED EMBODIMENTS

Hereinafter, an embodiment of the present invention will be described with reference to the drawings. An example illustrated below is a wireless receiver that receives a frequency modulated radio frequency (FMRF) signal from a wireless microphone as a transmitter and demodulates an audio signal, and FIG. 1 illustrates an entire configuration of the wireless receiver in a block diagram.

Figure 1:
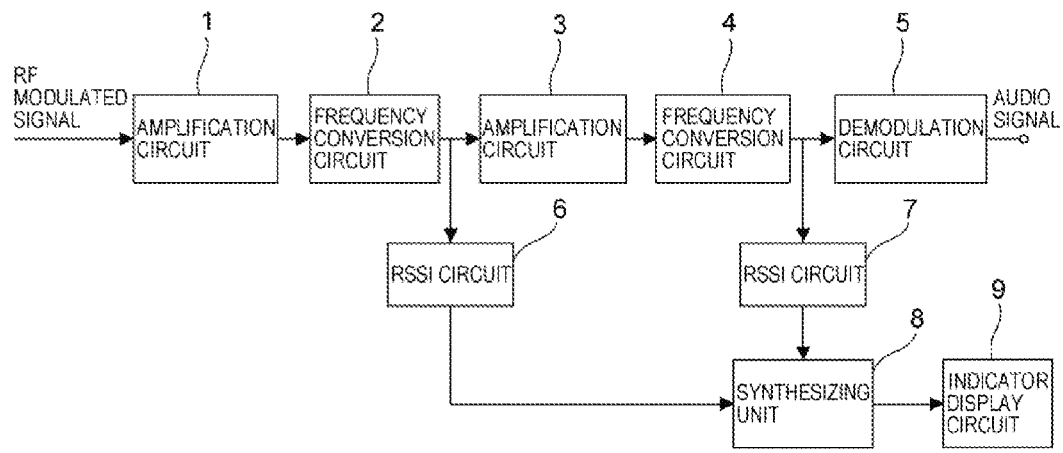
FIG. 1 is a block diagram illustrating an entire configuration of a wireless receiver according to the present invention.

An RF amplification circuit 1 in FIG. 1 is supplied with an RF signal from a receiving antenna not illustrated.

The RF amplification circuit 1 includes an attenuator (not illustrated) as an RF signal attenuation circuit at an input side of the circuit, and with the attenuator (ATT) an amount of attenuation of the RF signal applied from the receiving antenna to the RF amplification circuit 1 can be selected.

Incidentally, as for the RF signal attenuation circuit, instead of the attenuator (ATT), the amount of attenuation can be adjusted by controlling an amount of feedback of a gain adjustment circuit, for example an automatic gain control circuit (AGC) that adjusts amplification gain of the RF amplification circuit 1.

The RF signal from the RF amplification circuit 1 is supplied to a first frequency conversion circuit 2. The first frequency conversion circuit 2 is supplied with a signal from a first local signal oscillator (not illustrated) of, for example, a PLL synthesizer, and a first intermediate frequency signal (first IF signal) is generated from the RF signal and a first local signal. That is, by selection of the first local signal of the PLL synthesizer, the first intermediate frequency signal corresponding to a particular reception frequency is generated, and is supplied to an intermediate frequency amplification circuit 3. The first IF signal from the intermediate frequency amplification circuit 3 is supplied to a second frequency conversion circuit 4.

The second frequency conversion circuit 4 is supplied with a fixed local signal from a second local signal oscillator (not illustrated), and a second intermediate frequency signal (second IF signal) is generated from the first intermediate frequency signal (first IF signal) and a second local signal. That is, the wireless receiver adopts a double superheterodyne system.

The second intermediate frequency signal (second IF signal) is demodulated to the audio signal by a demodulation circuit 5 including a limiter amplifier, and is outputted to an audio processing circuit (not illustrated).

Figure 2:
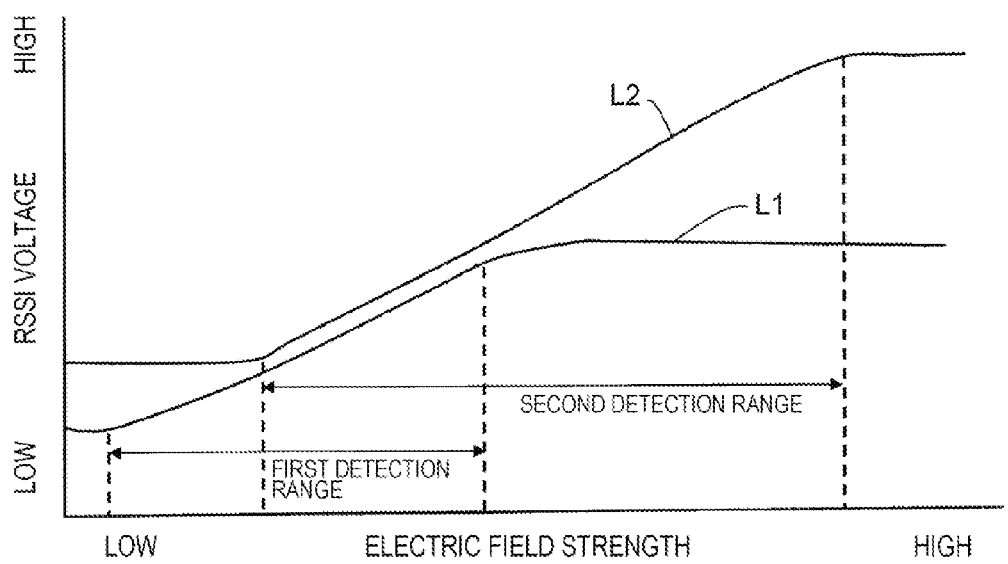
FIG. 2 is a graph illustrating a first receivable level range and a second receivable level range received by the wireless receiver of FIG. 1.

Meanwhile, the first intermediate frequency signal (first IF signal) is subjected to level detection in a first received signal strength indication (RSSI) circuit 6 (a first received radio wave strength measuring unit) and a received electric field strength is outputted to a synthesizing unit 8. The output obtained by level detection in the RSSI circuit 6 is information corresponding to the radio wave strength of the first intermediate frequency signal (first IF signal), and the RSSI circuit 6 has a characteristic by which a reception level can be detected in a weak electric field range (first detection range) as illustrated by L1 in a graph of FIG. 2, for example.

The second intermediate frequency signal (second IF signal) is subjected to level detection in a second RSSI circuit 7 (second received radio wave strength measuring unit) and the received radio wave strength is outputted. The output obtained by level detection in the RSSI circuit 7 is information corresponding to the radio wave strength of the second intermediate frequency signal (second IF signal), and the second RSSI circuit 7 has a characteristic by which a reception level can be detected in a range (second detection range) from a medium electric field to a strong electric field as illustrated by L2 in the graph of FIG. 2.

The detected level signal output from the RSSI circuit 7 is outputted to the synthesizing unit 8, and is subjected to synthesizing processing with the detected level signal from the RSSI circuit 6 of the first intermediate frequency signal (first IF signal).

Figure 3:
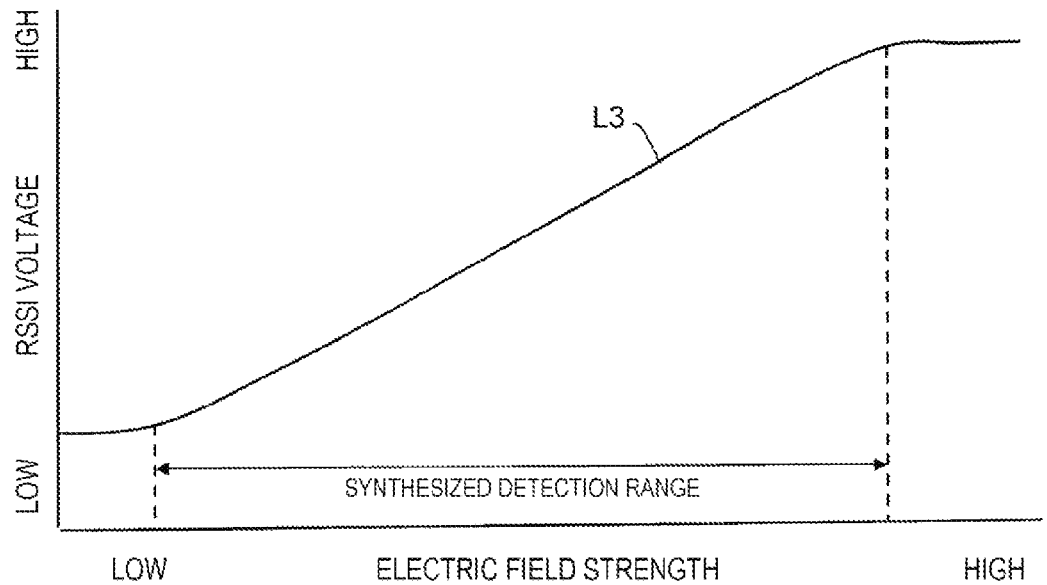
FIG. 3 is a graph illustrating a level range in which the first receivable level range and the second receivable level range of FIG. 2 are synthesized.

In the synthesizing unit 8, a level signal of the received radio wave strength obtained from the first intermediate frequency signal (first IF signal) and a level signal of the received radio wave strength obtained from the second intermediate frequency signal (second IF signal) are synthesized (for example, simple addition), and a detection signal having a dynamic range characteristic of a detection range from the weak electric field to the strong electric field is outputted to an indicator display circuit 9 as illustrated by L3 in a graph of FIG. 3. That is, the detection output signal illustrated in the graph of FIG. 3 shows a detection range, in which the detection range of the first intermediate frequency signal (first IF signal) and the detection range of the second intermediate frequency signal (second IF signal) are synthesized, of about 0 to 120 dBµVemf, for example.

The indicator display circuit 9 converts the input detection signal (synthesized level signal) into a digital signal with an A/D converter, and refers to a lookup table for indicator display to obtain a signal for indicator display corresponding to the detection signal, and performs display on an indicator (not illustrated).

As described above, with the embodiment according to the wireless receiver of the present invention, it is configured so that the radio wave strength in a range outside the measurable range of the first received radio wave strength measuring unit (RSSI circuit 6) is measured by the second received radio wave strength measuring unit (RSSI circuit 7), whereby it is possible to accurately display a radio wave reception state on an indicator in a wide dynamic range from the weak electric field to the strong electric field.

With the wireless receiver according to the present invention, the electric field strength can be accurately detected, so that a radio wave state in a usage environment can be correctly known, and, for example, the detection signal obtained can be used as a reference signal of the mute control or a reference signal of an attenuator (attenuation unit) to stably operate operation of the wireless microphone.

The wireless receiver according to the present invention will be further described based on an example. In the example, the following experiment was performed by using the wireless receiver described in the embodiment.

In the example, a reception strength detection range of the first intermediate frequency signal, a reception strength detection range of the second intermediate frequency signal, and a reception strength detection range of the synthesized level signal were measured in the wireless receiver having a configuration of the block diagram of the present invention illustrated in FIG. 1.

Specifically, an RSSI voltage of the first intermediate frequency signal, an RSSI voltage of the second intermediate frequency signal, and an RSSI voltage of the synthesized level signal were measured for each 10 dBμVemf over a range of electric field strength of −10 to 130 dBμVemf. The synthesized level signal was obtained by simple addition of the RSSI voltage of the first intermediate frequency signal and the RSSI voltage of the second intermediate frequency signal.

Figure 4:
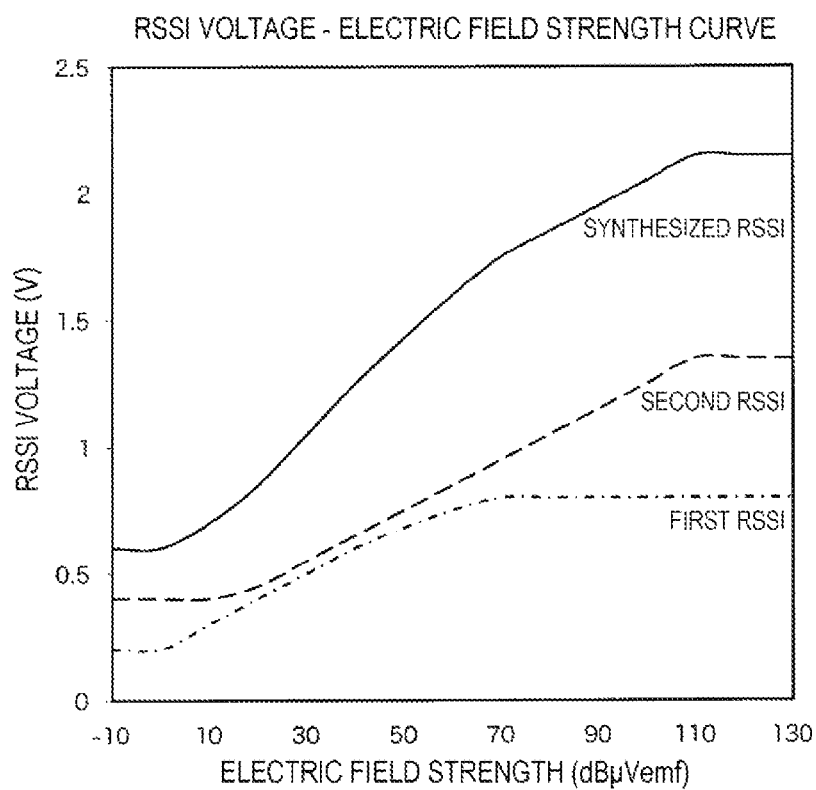
FIG. 4 is a graph illustrating a result of an example of the present invention.

A graph of FIG. 4 illustrates a result of the example. In the graph of FIG. 4, a chain line indicates change of the RSSI voltage (V) of the first intermediate frequency signal, a dashed line indicates change of the RSSI voltage (V) of the second intermediate frequency signal, and a solid line indicates change of the RSSI voltage (V) of the synthesized level signal.

As illustrated in FIG. 4, as a result of the example, it has been confirmed that the synthesized level signal is shown as an inclined line in a range of about 0 to 110 dBμVemf, and the received radio wave strength can be accurately detected over a wide range from the weak electric field to the strong electric field, with the wireless receiver of the present invention.

What is claimed is:

1. A wireless receiver that receives a radio wave from a wireless microphone and demodulates an audio signal, the wireless receiver comprising:
    a first frequency conversion unit that generates a first intermediate frequency signal based on the received radio wave signal;
    a second frequency conversion unit that generates a second intermediate frequency signal based on the first intermediate frequency signal;
    a first received radio wave strength measuring unit that detects a first level signal from the first intermediate frequency signal generated by the first frequency conversion unit;
    a second received radio wave strength measuring unit that detects a second level signal from the second intermediate frequency signal generated by the second frequency conversion unit; and
    a synthesizing unit that synthesizes the first level signal detected by the first received radio wave strength measuring unit and the second level signal detected by the second received radio wave strength measuring unit, and outputs a synthesized level signal.

2. The wireless receiver according to claim 1, comprising an indicating unit that displays radio wave strength on an indicator, based on the synthesized level signal output from the synthesizing unit.

3. The wireless receiver according to claim 1, comprising a muting unit that performs mute control by using the synthesized level signal output from the synthesizing unit, as a reference signal.

4. The wireless receiver according to claim 1, comprising an attenuation unit that performs attenuation processing of an RF signal by using the synthesized level signal output from the synthesizing unit, as a reference signal.

5. The wireless receiver according to claim 1, wherein the first level signal indicates that a reception level can be detected in a weak electric field range and the second level signal indicates that a reception level can be detected in a range from a medium electric field to a strong electric field.

* * * * *